(12) United States Patent
Tsukamoto et al.

(10) Patent No.: US 7,733,408 B2
(45) Date of Patent: Jun. 8, 2010

(54) OPTICAL DEVICE MODULE, OPTICAL PATH FIXING DEVICE, AND METHOD FOR MANUFACTURING OPTICAL DEVICE MODULE

(75) Inventors: Hiroaki Tsukamoto, Yamatotakada (JP); Nobuhito Hirosumi, Fukuyama (JP); Takashi Yasudome, Fukuyama (JP); Kazuo Kinoshita, Nara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 1052 days.

(21) Appl. No.: 11/388,940

(22) Filed: Mar. 23, 2006

(65) Prior Publication Data
US 2006/0221225 A1  Oct. 5, 2006

(30) Foreign Application Priority Data
Mar. 29, 2005  (JP)  ............................. 2005-095573

(51) Int. Cl.
*H04N 5/225* (2006.01)
(52) U.S. Cl. ..................................... 348/340
(58) Field of Classification Search ................ 348/340, 348/374, 208.7, 208.11, 208.99; 257/432, 257/433; 396/421
See application file for complete search history.

(56) References Cited

U.S. PATENT DOCUMENTS

| | | | |
|---|---|---|---|
| 6,122,009 A | | 9/2000 | Ueda |
| 6,225,686 B1 * | | 5/2001 | Matsuura ..................... 257/668 |
| 6,791,076 B2 | | 9/2004 | Webster |
| 2003/0048378 A1 | | 3/2003 | Kim et al. |
| 2004/0164981 A1 | | 8/2004 | Fujita et al. |
| 2004/0189854 A1 | | 9/2004 | Tsukamoto et al. |
| 2004/0189862 A1 * | | 9/2004 | Gustavsson et al. ......... 348/376 |
| 2004/0239793 A1 * | | 12/2004 | Lu et al. ..................... 348/340 |
| 2005/0212947 A1 * | | 9/2005 | Sato et al. ................... 348/340 |
| 2005/0237418 A1 * | | 10/2005 | Sakamoto ................... 348/340 |

FOREIGN PATENT DOCUMENTS

| | | |
|---|---|---|
| CN | 1534322 A | 6/2004 |
| EP | 1 347 637 A2 | 9/2003 |
| EP | 1 462 839 A1 | 9/2004 |
| JP | 55-175249 | 12/1980 |
| JP | 2003-110946 | 4/2003 |
| JP | 2003-179818 | 6/2003 |

(Continued)

*Primary Examiner*—Tuan Ho
(74) *Attorney, Agent, or Firm*—Edwards Angell Palmer & Dodge LLP; David G. Conlin; David A. Tucker

(57) ABSTRACT

A solid-state image sensor, a transparent cover, a DSP, a wiring board and the like are sealed in a sealing portion by molding of a synthetic resin, and fixed to an imaging unit. At this time, a portion of the transparent cover is exposed from the sealing portion. The optical path fixing device and the imaging unit sealed by the sealing portion are fixedly combined by engagement of hook engaging portions and hook portions, in a state where the lower end surface of a lens barrel comes into contact with the exposed portion. As the result, positioning accuracy of a lens with respect to a pixel area of the solid-state image sensor dose not deteriorate even if a substrate on which the solid-state image sensor is arranged is deflected or distorted.

27 Claims, 12 Drawing Sheets

FOREIGN PATENT DOCUMENTS

| | | |
|---|---|---|
| JP | 2004-55959 | 2/2004 |
| JP | 2004-266844 | 9/2004 |
| JP | 2004-282778 | 10/2004 |
| JP | 2004-296453 | 10/2004 |
| JP | 2004-297282 | 10/2004 |
| JP | 2004-301938 | 10/2004 |

* cited by examiner

F I G. 1
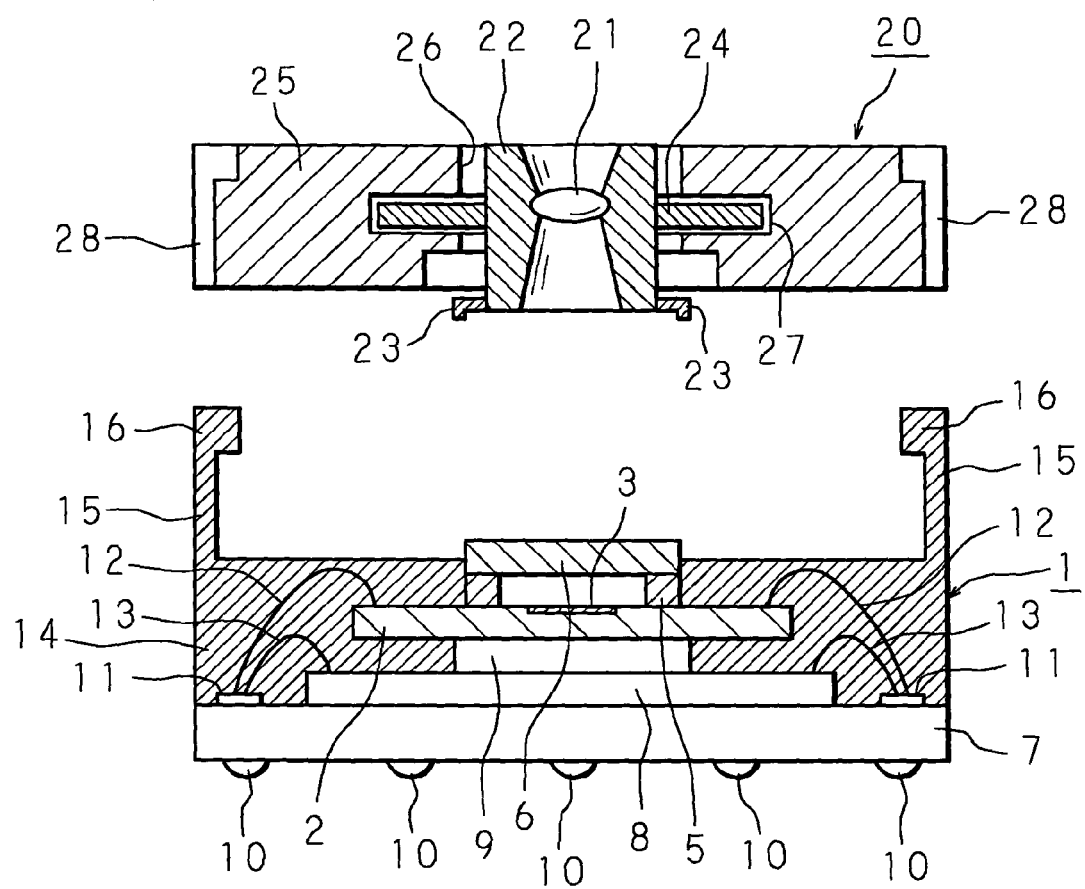

F I G. 5
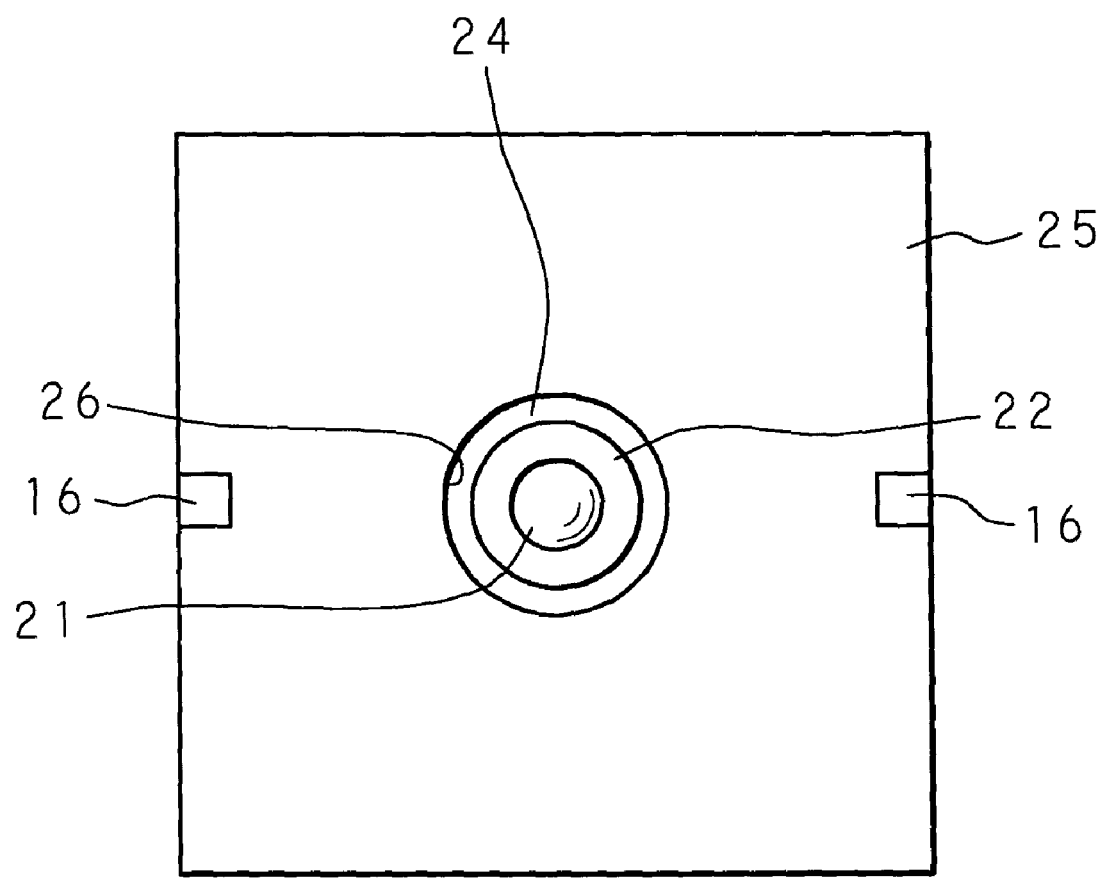

F I G. 7
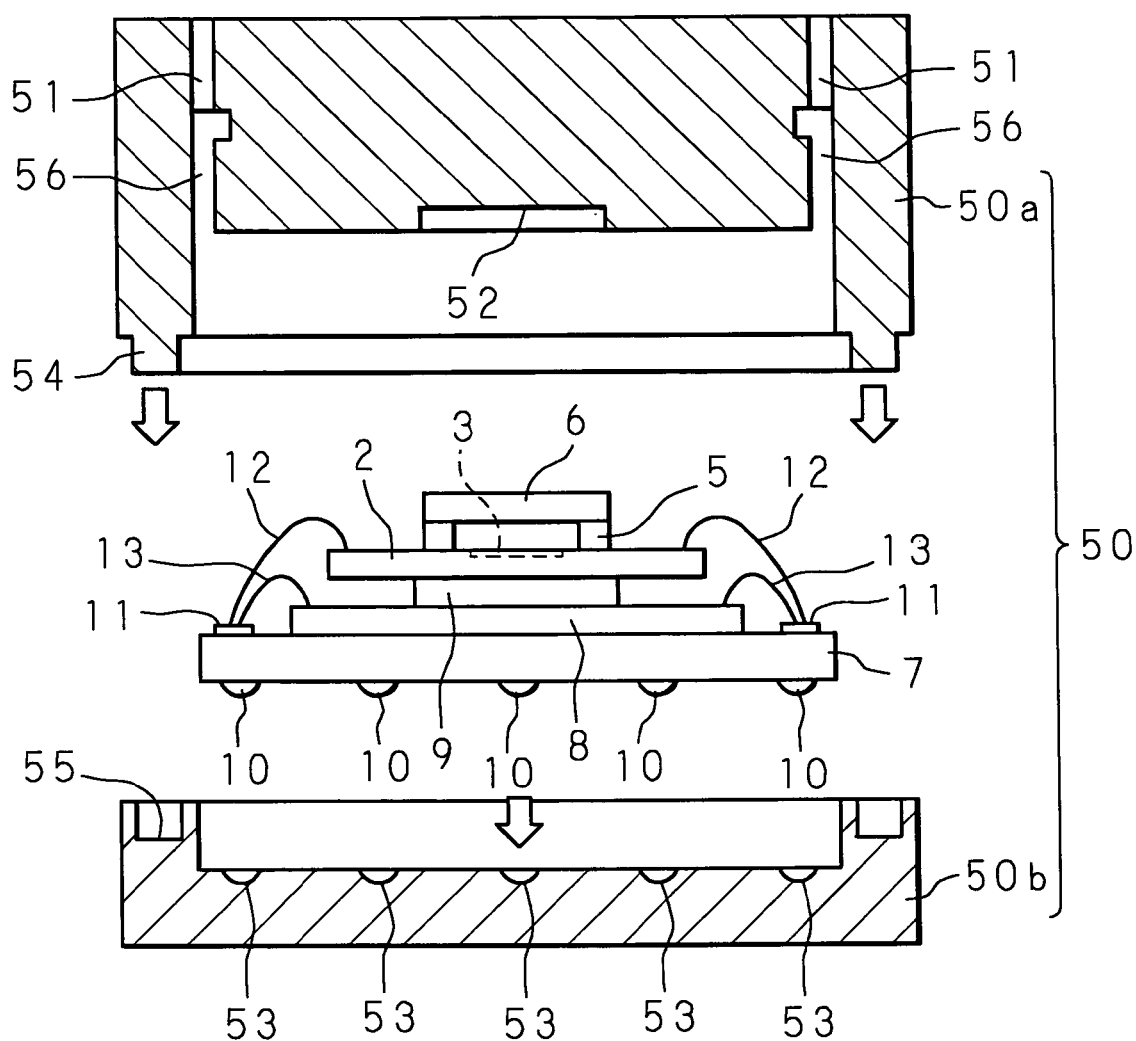

OPTICAL DEVICE MODULE, OPTICAL PATH FIXING DEVICE, AND METHOD FOR MANUFACTURING OPTICAL DEVICE MODULE

CROSS-REFERENCE TO RELATED APPLICATIONS

This non-provisional application claims priority under 35 U.S.C. §119(a) on Patent Application No. 2005-95573 filed in Japan on Mar. 29, 2005, the entire contents of which are hereby incorporated by reference.

BACKGROUND OF THE INVENTION

1. Field of the Invention

The present invention relates to an optical device module which is provided with a solid-state image sensor for photographing an object and is built in a digital camera, mobile phone with camera, digital video camera or the like, and relates to an optical path fixing device built in such an optical device module for fixing an optical path to the solid-state image sensor, further more, relates to a method for manufacturing such optical device module as described above.

2. Description of Related Art

A solid-state image sensor for use in a digital camera or a mobile phone with camera is used for capturing image of an object to be photographed and provided as an optical device module integrally assembled together with a lens, an infrared ray (IR) shield material, and an signal processing device for processing electric signal converted from image captured by the solid-state image sensor. Such a digital camera or a mobile phone with camera in which the optical device module is built in has now been demanded for downsizing. In response to or in advance of the demand for downsizing, the optical device module has been decreased in the overall size.

In the optical device module, an optical center of an effective pixel area of the solid-state image sensor needs to coincide with an optical center of a lens, and a plane made by the pixel area needs to intersect an optical axis of the lens at a right angle. In a case where positioning accuracy of the lens with respect to the solid-state image sensor is low, problems occur such that the solid-state image sensor may be out of focus or a dim image of the object to be captured is generated. For the reason, in a conventional optical device module, by previously incorporating an adjusting mechanism for focusing, focusing is carried out after assembling the conventional optical device module. However, as the adjusting mechanism which is used only in the assembling process is previously incorporated in the conventional optical device module, it will interrupt the downsizing of the optical device module. For compensation, some prior art schemes described below have been developed.

In Japanese Patent Application Laid-Open No. 2003-110946, proposed is a solid-state image sensor module package having a configuration in which a solid-state image sensor is adhered on a circuit board, a housing for holding an IR filter is adhered on the circuit board so as to enclose the solid-state image sensor, and a holder for holding a lens is fixed to the housing. In this prior art, since the holder and the housing is fixed by pressing, the assembling process is simplified.

Also in Japanese Patent Application Laid-Open No. 2004-297282, proposed is a camera module having a configuration in which a holding material for holding a lens and an optical filter is adhered by an adhesive to a package on which an image sensor is mounted. In this prior art, adhering is carried out with use of the adhesive consists of two different adhesives: a volatile curable adhesive which is cured as it volatilizes and an ultraviolet curable adhesive which is cured when exposed to ultraviolet ray, thus allowing the position of the lens to be adjusted after temporal adhering. When the position of the lens has been adjusted, the adhesive is exposed to ultraviolet ray for curing. In this prior art, since the position of the lens can be adjusted after the temporal adhering, it can be improved in the accuracy of positioning the lens.

Further, in Japanese Patent Application Laid-Open No. 2004-301938, proposed is an optical device module having a configuration in which an signal processing device for processing signals outputted from a solid-state image sensor is adhered to a wiring board, the solid-state image sensor is adhered on the signal processing device, a transparent cover is adhered to the surface of the solid-state image sensor, and a lens holding material for holding a lens is adhered to the transparent cover. In this prior art, since the lens holding material is adhered to the transparent cover, and the transparent cover is adhered on the surface of the solid-state image sensor, the accuracy of positioning the lens relative to the solid-state image sensor can be improved.

However, the image sensor module package disclosed in Japanese Patent Application Laid-Open No. 2003-110946 adopts the configuration in which the holder for holding the lens is fixed to the housing adhered on the circuit board. Accordingly, any manufacturing error which is derived from the circuit board or the housing may interrupt the relative positional relationship of the lens to the solid-state image sensor.

The camera module disclosed in Japanese Patent Application Laid-Open No. 2004-297282 adopts the configuration in which the holding material for holding the lens is adhered to the package. When the package is deflected or distorted at its surface, which serves as a reference plane for adhering, by the effect of manufacturing error, it may interrupt the accuracy of positioning the lens relative to the image sensor.

The optical device module disclosed in Japanese Patent Application Laid-Open No. 2004-301938 adopts the configuration in which the lens holding material is adhered to the transparent cover, and the transparent cover is adhered to the solid-state image sensor. Since the adhering between the solid-state image sensor and the transparent cover is carried out by a sheet form adhesive, the transparent cover can be adhered to the solid-state image sensor with high accuracy, thus improving the positional accuracy of the lens relative to the transparent cover. In this prior art, however, since the signal processing device, the solid-state image sensor and the transparent cover are placed upon the substrate while the lens holding material is adhered to the transparent cover, the solid-state image sensor, the signal processing device and the like may be injured by any impact urged on the lens holding material.

Moreover, each of the prior arts, the lens holding material for holding the lens is adhered by the adhesive to the transparent cover, the substrate or the like. It is however difficult to apply a uniform thickness of the adhesive at coating. Since, at the time of adhering the lens holding material to the transparent cover, adhering portion is parallel to the upper surface of the transparent cover, that is, the radial direction of the lens, there is a fear that the optical path is intersected by overflowing excessive adhesive when adhesive is excessively coated.

BRIEF SUMMARY OF THE INVENTION

The present invention has been devised in view of such circumferences and its object is to provide an optical device module configured in which a holding material for holding an optical component (a lens) of an optical path fixing device is fixed to a transparent cover adhered to the upper surface of a solid-state image sensor in a state of coming into contact with the same so that the positioning accuracy of the optical component with respect to the solid-state image sensor can be improved, and which the solid-state image sensor and the transparent cover are sealed in a synthetic resin thus to be protected from any external impact.

It is another object of the present invention to provide an optical device module configured for protection against external impacts, in which a wiring board and an signal processing device are sealed together with the solid-state image sensor and the transparent cover by a synthetic resin so that the signal processing device can be protected from any external impact.

It is a further object of the present invention to provide an optical device module configured in which the imaging unit is provided with hook portions while the optical path fixing device is provided with hook engaging portions so that the imaging unit and the optical path fixing device are fixedly combined to each other by the engagement between the hook portions and the hook engaging portions.

It is a still further object of the present invention to provide an optical device module configured in which hook portions for fixedly combining the imaging unit to the optical path fixing device are formed integral with the synthetic resin which is used for sealing the components of the imaging unit, whereby the forming of the hook portions can be simplified.

It is a still further object of the present invention to provide an optical device module configured in which the holding material for holding an optical component of the optical path fixing device is provided with positioning members which uniquely determine the positional relationship between the holding material and the transparent cover, whereby the positioning between the holding material for holding the optical component and the transparent cover can be simplified in the manufacturing process.

It is a still further object of the present invention to provide an optical device module configured in which positioning members of a hook shape are provided for holding material at least two portions of the side surfaces of the transparent cover when the holding material for holding the optical component of the optical path fixing device comes into contact with one surface of the transparent cover of a plate-like shape which is exposed partially from the sealing portion of the synthetic resin in the imaging unit, whereby the positional relationship between the holding material for holding the optical component and the transparent cover can uniquely be determined and thus the positioning of the holding material for holding the optical component with respect to the transparent cover can easily be carried out during the manufacturing process.

It is a still further object of the present invention to provide an optical device module configured in which the optical path fixing device includes an elastic material mounted on the holding material for holding the optical component and a support material for supporting the elastic material so that, when the optical path fixing device is fixedly combined to the imaging unit, the elastic material presses down the holding material for holding the optical component against the transparent cover thus to ensure the fixing between the holding material for holding the optical component and the transparent cover.

It is a still further object of the present invention to provide an optical device module configured in which the elastic material is supported by the support material so as to be movable with respect to the support material, whereby, when the optical path fixing device is fixedly combined to the imaging unit, the positioning of the holding material for holding the optical component with respect to the transparent cover can easily be carried out during the manufacturing process.

It is a still further object of the present invention to provide an optical device module configured in which the holding material for holding the optical component comes into contact with the transparent cover but never the sealing portion formed by the synthetic resin when the optical path fixing device is fixedly combined to the imaging unit, hence surly positioning the holding material for holding the optical component with respect to the transparent cover.

It is a still further object of the present invention to provide an optical path fixing device configured in which the holding material for holding the optical component includes positioning members provided for uniquely determining its relative positional relationship with respect to an object to which the optical path from the optical component is fixed, whereby the positioning of the holding material for holding the optical component can easily be carried out during the manufacturing process.

It is a still further object of the present invention to provide an optical path fixing device configured in which an elastic material fixed to the holding material for holding the optical component and a support material for supporting the elastic material are provided so that the holding material for holding the optical component is pressed against the object by the action of the elastic material, hence fixing the holding material for holding the optical component to the object.

It is a still further object of the present invention to provide an optical path fixing device configured in which the elastic material is supported by the support material relatively movable with respect to the support material, whereby the positioning of the holding material for holding the optical component can easily be carried out when the optical path fixing device is fixedly combined to the object during the manufacturing process.

It is a still further object of the present invention to provide a method for manufacturing the optical device module which comprises a sealing step of sealing the solid-state image sensor and the transparent cover by the synthetic resin so that the solid-state image sensor and the transparent cover can be protected from any external impact, and a step of fixedly combining the optical path fixing device to the imaging unit in a state where the holding material for holding the optical component in the optical path fixing device comes into contact with the transparent cover so that the optical path fixing device can be fixedly combined to the imaging unit while the positioning of the optical component with respect to the solid-state image sensor can be carried out at higher accuracy.

It is a still further object of the present invention to provide a method for manufacturing the optical device module configured in which the sealing step also involves sealing the wiring board and the signal processing device together with the solid-state image sensor and the transparent cover with the synthetic resin, whereby the optical device capable of facilitate the manufacturing process and protecting the signal processing device from any physical injury.

It is a still further object of the present invention to provide a method for manufacturing the optical device module configured in which the sealing step also involves forming with the synthetic resin hook portions for fixedly joining the optical path fixing device to the imaging unit, whereby the combining between the optical path fixing device and the imaging unit can be facilitated.

An optical device module according to the present invention is an optical device module comprising: an imaging unit including a solid-state image sensor having a pixel area, a transparent cover provided opposite to the pixel area, and an adhesive portion for adhering the transparent cover to the solid-state image sensor; an optical path fixing device which includes an optical component and a holding material for holding the optical component, and fixes the optical path between the optical component and the pixel area; and combining means for fixedly combining the optical path fixing device to the imaging unit; and is characterized in that the imaging unit includes a sealing portion where the solid-state image sensor and the transparent cover are sealed by a synthetic resin in a state where a part of or all of the transparent cover is exposed, and the combining means fixedly combines the optical path fixing device to the imaging unit so that the optical path fixing device is positioned with respect to the imaging unit in a state where the holding material comes into contact with the exposed portion of the transparent cover outwardly of the sealing portion.

In the optical device module according to the present invention, while the solid-state image sensor and the transparent cover are sealed by the synthetic resin so as to expose a portion of the transparent cover adhered to the solid-state image sensor, the optical path fixing device is fixedly combined to the imaging unit in a state where the holding material coming into contact with the exposed portion of the transparent cover. Since the transparent cover is adhered at higher accuracy to the solid-state image sensor, the positioning accuracy of the optical component with respect to the solid-state image sensor can be improved. Also, the solid-state image sensor and the transparent cover are sealed by the synthetic resin and can thus be protected from external impacts.

According to the optical device module of the present invention, since the solid-state image sensor and the transparent cover are sealed by the synthetic resin, the solid-state image sensor and the transparent cover are protected from external impacts and prevent them from injury causing impact. Also, since the holding material for holding the optical component of the optical path fixing device is arranged in a case where it comes into contact with the transparent cover, the positioning accuracy of the optical component with respect to the solid-state image sensor do not deteriorate even if the substrate on which the solid-state image sensor is mounted is deflected or distorted. Moreover, since the optical path fixing device is fixed to the transparent cover with no use of an adhesive, the position of the optical component never vary by an error in the thickness of the adhesive. As the result, since it is not necessary for previously assembling a mechanism for adjusting the focusing after the assembling, the overall dimensions of the optical device module can be minimized.

An optical device module according to the present invention is characterized in that the imaging unit includes a wiring board on which conductor wirings are formed, and an signal processing device mounted on the wiring board and electrically connected to the conductor wirings, and the sealing portion seals the solid-state image sensor and the transparent cover together with the wiring board and the signal processing device by the synthetic resin.

In the optical device module according to the present invention, the wiring board and the signal processing device are sealed together with the solid-state image sensor and the transparent cover by the synthetic resin. As a result, the wiring board, the signal processing device, the solid-state image sensor, and the transparent cover are rigidly fixed together, thus increasing the strength against external impact and facilitating the manufacturing process.

According to the optical device module of the present invention, the optical device module can be manufactured with much ease, hence reducing the overall cost of the manufacturing process and preventing the solid-state image sensor and the signal processing device from being injured by external impacts.

An optical device module according to the present invention is characterized in that the combining means includes hook portions provided on the imaging unit, and hook engaging portions provided on the optical path fixing device for engaging with the hook portions, and the optical path fixing device is fixedly combined to the imaging unit by engaging the hook portions and the hook engaging portions.

In the optical device module according to the present invention, there are provided the hook portions on the imaging unit and the hook engaging portions in the optical path fixing device for engaging with the hook portions. Since the optical path fixing device and the imaging unit are fixedly combined by engaging the hook portions and the hook engaging portions, the combining between the optical path fixing device and the imaging unit can thus be easily realized.

According to the optical device module of the present invention, since the optical path fixing device and the imaging unit are fixedly combined by engaging the hook portions and the hook engaging portions, thus simplifying the manufacturing process.

An optical device module according to the present invention is characterized in that the hook portions are formed integral with the sealing portion by the synthetic resin.

In the optical device module according to the present invention, the hook portions for fixedly combining the imaging unit and the optical path fixing device are formed integral with the sealing portion by the synthetic resin for sealing the solid-state image sensor and the other components. This allows the hook portions to be fabricated with ease during the manufacturing process.

According to the optical device module of the present invention, the hook portions can be formed with ease, thus requiring no complexity of the manufacturing process and increasing no extra of the manufacturing cost for separately forming the hook portions.

An optical device module according to the present invention is characterized in that the holding material includes positioning members provided for determining the relative positional relationship to the transparent cover.

In the optical device module according to the present invention, the holding material for holding the optical component includes the positioning members for determining the relative positional relationship between the holding material for holding the optical component of the optical path fixing device and the transparent cover of the imaging unit. Since the holding material for holding the optical component is uniquely positioned when coming into contact with the transparent cover at assembling the optical device module, the positioning between the holding material for holding the optical component and the transparent cover can easily be carried out during the manufacturing process.

According to the optical device module of the present invention, the positioning between the holding material for holding the optical component and the transparent cover can be easily carried out, thus simplifying the manufacturing process.

An optical device module according to the present invention is characterized in that the transparent cover has a plate-like shape and whose one surface and a part of or all of the side surfaces are exposed from the sealing portion, and the positioning members are hook shaped members for engaging with at least two portions of the side surfaces of the transparent cover when the holding material comes into contact with the one surface of the transparent cover.

In the optical device module according to the present invention, a portion of the transparent cover of a plate-like shape is exposed from the synthetic resin of the sealing portion. When the holding material for holding the optical component of the optical path fixing device comes into contact with one surface of the transparent cover, the hook portions of the positioning members of the holding material for holding the optical component engage with at least two portions of the side surfaces of the transparent cover, so that the relative positional relationship between the holding material for holding the optical component and the transparent cover is fixed. This permits the relative positional relationship between the holding material for holding the optical component and the transparent cover to be uniquely determined upon the holding material for holding the optical component coming into contact with the transparent cover.

According to the optical device module of the present invention, the positional relationship between the holding material and the transparent cover to be uniquely determined and the positioning between the holding material for holding the optical component and the transparent cover can be easily carried out, thus simplifying the manufacturing process.

An optical device module according to the present invention is characterized in that the optical path fixing device includes an elastic material fixed to the holding material, and a support material for supporting the elastic material, and when the optical path fixing device is fixedly combined to the imaging unit by the combining means, the holding material is pressed down against the transparent cover by the action of the elastic material while the holding material remains in contact with the one surface of the transparent cover.

In the optical device module according to the present invention, the elastic material is fixed to the holding material for holding the optical component, and the support material for supporting the elastic material is, provided on the optical path fixing device. Accordingly, when the optical path fixing device is fixedly combined to the imaging unit, the elastic material presses down the holding material for holding the optical component against the transparent cover, thus the holding material for holding the optical component is securely fixed to the transparent cover. Also, the elastic material can absorb any external impact, hence improving the strength against impact.

According to the optical device module of the present invention, the holding material for holding the optical component is pressed against the transparent cover by the elastic material when the optical path fixing device is fixedly combined to the imaging unit, thus strengthening the combining between the holding material for holding the optical component and the transparent cover. Also, as the elastic material absorbs any impact from the outside, it can prevent the solid-state image sensor and the transparent cover from being injured by the impact.

An optical device module according to the present invention is characterized in that the elastic material is supported by the support material, and is movable with respect to the support material.

In the optical device module according to the present invention, the elastic material is supported by the support material relatively movable with respect to the support material. This facilitates the positioning of the holding material for holding the optical component and the transparent cover when the optical path fixing device is fixedly combined to the imaging unit during the manufacturing process.

According to the optical device module of the present invention, the positioning between the holding material for holding the optical component and the transparent cover is easily carried out when the optical path fixing device is fixedly combined to the imaging unit during the manufacturing process, hence simplifying the manufacturing process.

An optical device module according to the present invention is characterized in that the holding material and the positioning members are sized so as not to come into contact with the sealing portion when the optical path fixing device is fixedly combined to the imaging unit.

In the optical device module according to the present invention, the holding material for holding the optical component comes into contact with the transparent cover but not the sealing portion of the synthetic resin when the optical path fixing device is fixedly combined to the imaging unit. Accordingly, there is no fear that deviation of the positional relationship between the holding material for holding the optical component and the transparent cover caused by contacting the holding material with the sealing material occurs, and the holding material for holding the optical component is surely positioned with respect to the transparent cover.

According to the optical device module of the present invention, the holding material for holding the optical component can be surely positioned with respect to the transparent cover, thus ensuring no declination in the positional accuracy of the optical component with respect to the solid-state image sensor.

An optical path fixing device according to the present invention is characterized in that the holding material and the positioning members are sized so as not to come into contact with the sealing portion when the optical path fixing device is fixedly combined to the imaging unit.

In the optical path fixing device according to the present invention, the positioning members for uniquely determining the positioning relationship of the holding material for holding the optical component with respect to the object to which the optical path is to be fixed is provide on the holding material having the optical component, thus simplifying the positioning of the holding material for holding the optical component in the manufacturing process.

According to the optical path fixing device of the present invention, the positioning of the holding material with respect to the object to which the optical path is to be fixed becomes easy, thus simplifying the manufacturing process.

An optical path fixing device according to the present invention is characterized by further comprising: an elastic material fixed to the holding material; and a support material for supporting the elastic material.

In the optical path fixing device according to the present invention, the elastic material is fixed to the holding material for holding the optical component and the support material for supporting the elastic material is provided on the optical path fixing device. Accordingly, the elastic material presses the holding material for holding the optical component against the object when the optical path fixing device is fixed to the object, thus strengthening the fixing of the holding material for holding the optical component. Also, the elastic material can absorb any external impact, thus ensuring the strength against external impacts.

According to the optical path fixing device of the present invention, the holding material for holding the optical component is securely fixed to the object while the elastic material absorb any external impact, thus preventing the object, to which the optical path is fixed, from being injured.

An optical path fixing device according to the present invention is characterized in that the elastic material is supported by the support material, and is movable with respect to the support material.

In the optical path fixing device according to the present invention, the elastic material is supported by the support material relatively movable with respect to the support material. As a result, the positioning of the holding material for holding the optical component becomes easy when the optical path fixing device is fixedly combined during the manufacturing process.

According to the optical path fixing device of the present invention, the positioning between the holding material for holding the optical component and the object, to which the optical path is fixed, becomes easy when the optical path fixing device is fixed to the object, thus simplifying the manufacturing process.

A method for manufacturing the optical device module is a method for manufacturing the optical device module which comprises: an imaging unit including a solid-state image sensor having a pixel area, a transparent cover provided opposite to the pixel area, and an adhesive portion for adhering the transparent cover to the solid-state image sensor; and an optical path fixing device which includes an optical component and a holding material for holding the optical component, and fixes the optical path between the optical component and the pixel area; and is characterized by comprising: sealing step of sealing the solid-state image sensor and the transparent cover by a synthetic resin; and step of fixedly combining the optical path fixing device to the imaging unit in a case where the holding material comes into contact with the transparent cover.

In the method for manufacturing the optical device module according to the present invention, the solid-state image sensor and the transparent cover are sealed by the synthetic resin in the sealing step, hence protecting the solid-state image sensor and the transparent cover from external impacts. Also, the optical path fixing device is fixed to the imaging unit in a state where the optical path fixing device comes into contact with the transparent cover which is adhered to the surface of the solid-state image sensor, thus ensuring the positioning accuracy of the optical component with respect to the solid-state image sensor.

According to the method for manufacturing the optical device module of the present invention, means for protecting the solid-state image sensor and the transparent cover from external impacts is easily formed, thus preventing any injury of the solid-state image sensor. Also, the positioning of the optical component with respect to the solid-state image sensor can accurately be carried out, thus eliminating the need of preparing a mechanism for adjusting the focusing after the assembling. As the result, the optical device module can be minimized in the overall size.

A method for manufacturing the optical device module according to the present invention is characterized in that the sealing step further includes the step of sealing, by a synthetic resin, a wiring board on which conductor wirings are provided, and an signal processing device which is fixed to the wiring board and electrically connected to the conductor wirings.

In the method for manufacturing the optical device module according to the present invention, the wiring board and the signal processing device as well as the solid-state image sensor and the transparent cover are sealed by the synthetic resin in the sealing step. This permits the optical device module to be manufactured by a simpler manner and improved in the strength against impacts.

According to the method for manufacturing the optical device module of the present invention, the manufacturing process can be more simplified, and the solid state image sensor and the signal processing device are protected from being injured by external impacts.

A method for manufacturing the optical device according to the present invention is characterized in that the sealing step further includes the step of forming, by a synthetic resin, hook portions for fixedly combining the optical path fixing device to the imaging unit.

In the method for manufacturing the optical device module according to the present invention, in the sealing step, the hook portions for fixedly joining the optical path fixing device to the imaging unit are integrally formed by the synthetic resin for sealing the solid-state image sensor and the other components. This permits the combining means between the optical path fixing device and the imaging unit to be easily formed.

According to the method for manufacturing the optical device module of the present invention, means for combining the optical path fixing device and the imaging unit can be easily formed, thus requiring no complexity of the manufacturing process and increasing no extra of the manufacturing cost for separately forming the hook portions.

The above and further objects and features of the present invention will more fully be apparent from the following detailed description with the accompanying drawings.

BRIEF DESCRIPTION OF THE DRAWINGS

FIG. 1 is a schematic cross sectional view of a configuration of the optical device module, where an image path fixing device is not fixed to an imaging unit, according to the present invention;

FIG. 5 is a schematic plan view showing an external appearance of the optical device module according to the present invention;

FIG. 7 is a schematic view showing a manufacturing process of the optical device module of the present invention;

DETAILED DESCRIPTION OF THE PREFERRED EMBODIMENTS

Preferred embodiments of the present invention will be described in more detail, referring to the relevant drawings.

Figure 2:
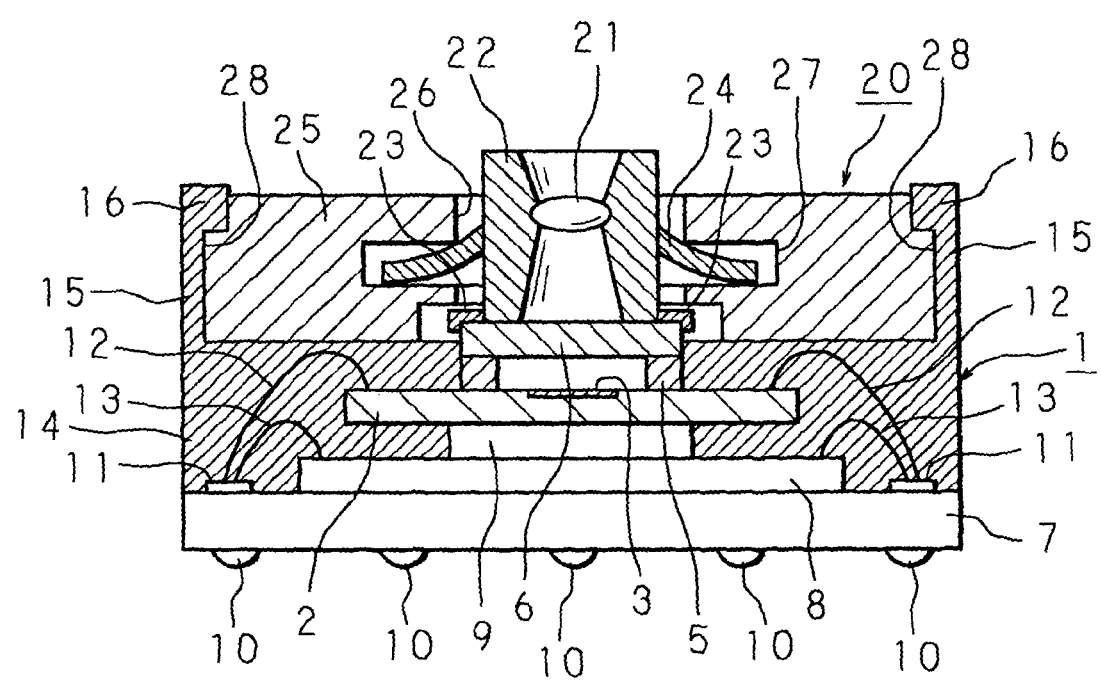
FIG. 2 is a schematic cross sectional view of a configuration of the optical device module, where the image path fixing device is fixed to the imaging unit, according to the present invention.

FIG. 1 and FIG. 2 are schematic cross sectional views of a configuration of an optical device module according to the present invention. More particularly, FIG. 1 illustrates a state where an optical path fixing device is not fixedly combined to an imaging unit of the optical device module, and FIG. 2 illustrates a state where the optical path fixing device is fixedly combined to the same.

Figure 3:
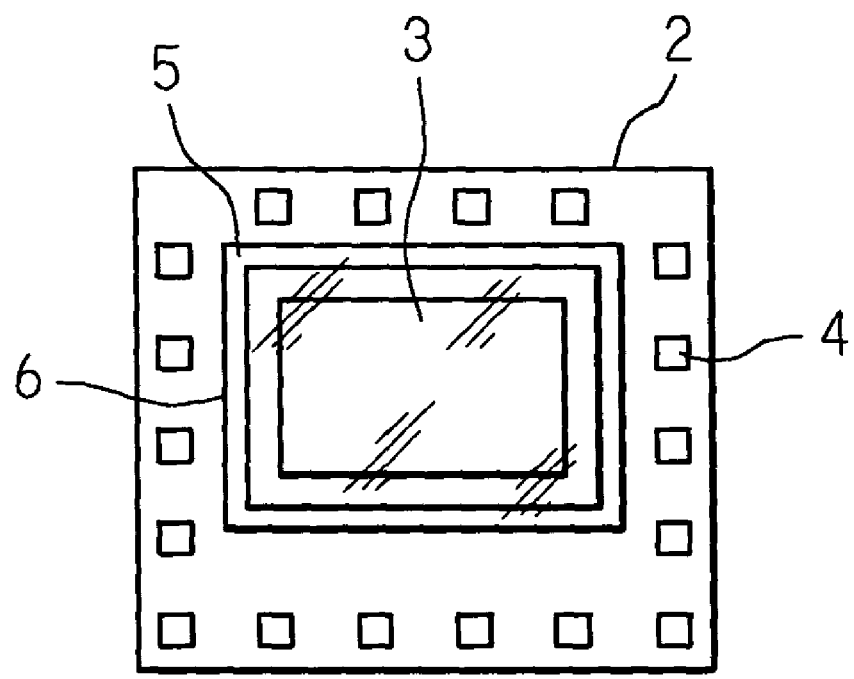
FIG. 3 is a schematic plan view of a solid-state image sensor of the optical device module according to the present invention.
Figure 4:
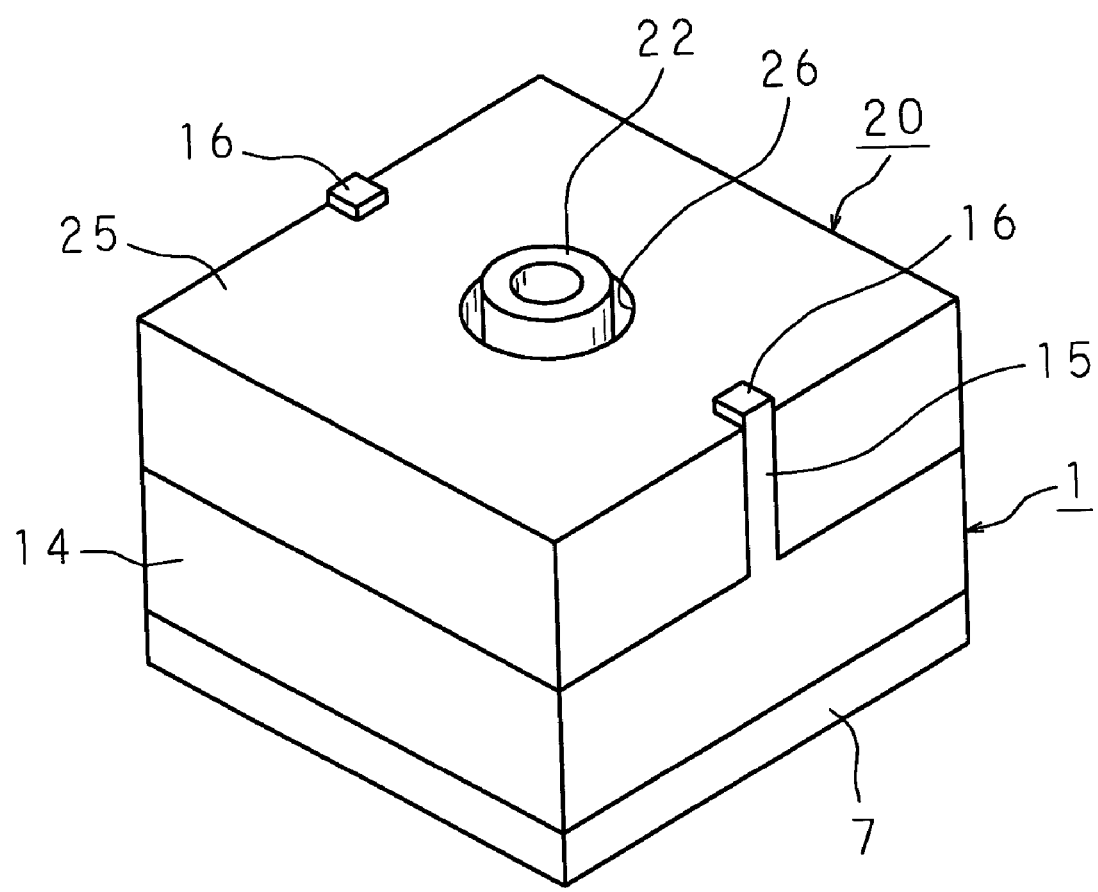
FIG. 4 is a schematic perspective view showing an external appearance of the optical device module according to the present invention.
Figure 6:
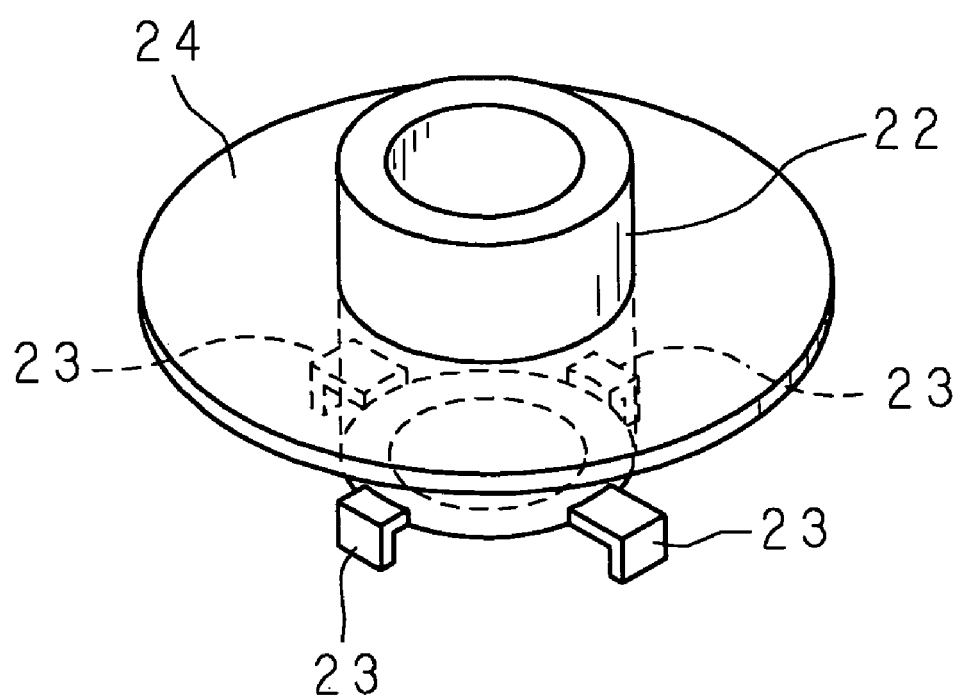
FIG. 6 is a schematic perspective view showing a configuration of a holding material of the optical path fixing device of the optical device module according to the present invention.

FIG. 3 is a schematic plan view of a solid-state image sensor of the optical device module of the present invention. FIG. 4 is a schematic perspective view showing an external appearance of the optical device module of the present invention. FIG. 5 is a schematic plan view showing an external appearance of the optical device module of the present invention. FIG. 6 is a schematic perspective view showing a holding material of the optical path fixing device of the optical device module of the present invention.

Throughout the drawings, reference numeral 1 denotes an imaging unit which has a solid-state image sensor 2 for receiving light from the outside, and reference numeral 20 denotes an optical path fixing device which has a lens 21 as an optical component. The imaging unit 1 and the optical path fixing device 20 are manufactured separately and thereafter assembled as the optical device module by securing the optical path fixing device 20 to the imaging unit 1. The imaging unit 1 is provided with the solid-state image sensor 2, a transparent cover 6 for protecting the solid-state image sensor 2, a DSP (Digital Signal Processor) 8 as the signal processing device, and the like, and is configured by placing them upon a wiring board 7.

The solid-state image sensor 2 is formed by applying a well known semiconductor processing technique on a semiconductor substrate such as silicon or the like. Provided on one surface (referred to as an upper surface hereinafter, the opposite surface being therefore referred to as a lower surface) of the solid-state image sensor 2 is a pixel area 3 for photoelectric conversion and a plurality of bonding pads 4 as connecting terminals for connecting with an external circuit for inputting/outputting electric signals and for power supplying (See FIG. 3). The transparent cover 6 is adhered opposite to the pixel area 3, by an adhesive portion 5, to the upper surface of the solid-state image sensor 2 on which the pixel area 3 is formed.

The adhesive portion 5 is formed in substantially a rectangular frame shape surrounding the outer peripheral portion of the pixel area 3 (see FIG. 3). When the transparent cover 6 having substantially a rectangular shape is adhered by the adhesive portion 5 to the upper surface of the solid-state image sensor 2, it is configured so as to seal a space between the transparent cover 6 and the pixel area 3. The space between the transparent cover 6 and the pixel area 3 is sealed to inhibit any moisture or dust from entering and disturbing the pixel area 3, thereby preventing generation of fault on the pixel area 3.

The transparent cover 6 is plate form rectangular shape, and is made of transparent material such as glass. The solid-state image sensor 2 receives an incident light, which has passed through the transparent cover 6, at its photo receiving elements arranged on the pixel area 3. When an infrared ray shielding film is formed on the surface of the transparent cover 6, the transparent cover 6 can be provided with a function for cutting off infrared rays from the outside.

The adhesive portion 5 is formed in a frame-like shape by patterning in which sheet form adhesive is adhered to either the upper surface of the solid-state image sensor 2 or a surface (hereinafter referred to as a lower surface, and the opposite surface being referred to as an upper surface) of the transparent cover 6 opposite to the solid-state image sensor 2, and the sheet form adhesive is processed such as exposure and development by a photolithographic technique. It is possible to conduct the patterning of the adhesive portion 5 at higher accuracy by using the photolithographic technique, and to make the adhesive portion 5 uniform in thickness by using an adhesive in a sheet form. By such idea, the transparent cover 6 can be adhered to the solid-state image sensor 2 by positioning relative to the pixel area 3 with high accuracy.

The solid-state image sensor 2 on which the transparent cover 6 is adhered is placed, together with the DSP 8, upon the wiring board 7 having been conductor wirings 11 are formed by patterning. More specifically, the DSP 8 is adhered on the wiring board 7 at first, a spacer 9 of a rectangular plate form silicon piece is adhered on the DSP 8, and the solid-state image sensor 2 is adhered on the spacer 9. The DSP 8 is a semiconductor chip for controlling the operation of the solid-state image sensor 2 and processes signals outputted from the solid-state image sensor 2. With the solid-state image sensor 2 and the DSP 8 incorporated together in a same single module, the overall size of a digital camera or a mobile phone with camera including the optical device module can be minimized. The DSP 8 has a plurality of bonding pads (not shown) provided on a surface thereof for inputting/outputting electric signals and the like. After the DSP 8 is adhered on the wiring board 7, the bonding pads of the DSP 8 and the conductor wirings 11 on the wiring board 7 are electrically connected to each other by bonding wires 13.

Also, the bonding pads 4 of the solid-state image sensor 2 adhered on the spacer 9 and the conductor wirings 11 on the wiring board 7 are electrically connected to each other by bonding wires 12. As a result, since the DSP 8 and the solid-state image sensor 2 are electrically connected through the conductor wirings 11 on the wiring board 7, electric signal are transmitted and received between the DSP 8 and the solid-state image sensor 2 to each other. Distance between the solid-state image sensor 2 and the DSP 8 are favorably adjusted by the spacer 9, so that the bonding wires 12 do not contact with either the DSP 8 or the bonding wires 13 connected to the DSP 8.

The solid-state image sensor 2 and the DSP 8 and the like placed upon the wiring board 7 are fixed by being sealed in a sealing portion 14 formed by a synthetic resin. The sealing portion 14 is formed in substantially a rectangular parallelepiped shape disposed on the wiring board 7 (see FIG. 4). The upper surface and an upper half of four side surfaces of the transparent cover 6 are protruded from the upper surface of the sealing portion 14. A pair of arm portions 15 each of which is substantially a rectangular shape are provided upwardly protruding on two opposite sides at substantially the center of the upper surface of the sealing portion 14, respectively. Each of the arm portions 15 has, at respective upper end portions, an inwardly extending hook portion 16.

A plurality of semi-spherical connectors 10 are protruded from and provided on the lower surface of the wiring board 7 for inputting/outputting signals between the optical device module and a digital camera or mobile phone with camera. The connectors 10 are electrically connected with the conductor wirings 11 formed on the upper surface of the wiring board 7.

The optical path fixing device 20 for guiding the light from the outside to the pixel area 3 of the solid-state image sensor 2 is provided with the lens 21, a lens barrel 22 as a holding material for holding the lens 21, and a support material 25 supporting the lens barrel 22 via an elastic material 24. The lens barrel 22 is a member of a cylindrical hollow shape. The lens 21 is fixedly mounted at the inner peripheral surface of the lens barrel 22 so that an optical axis of the lens 21 and an optical axis of the lens barrel 22 coincide with each other.

Four positioning hooks (positioning member) 23 are provided at quartered positions, respectively along the outer peripheral surface of one end portion of the lens barrel 22, particularly, the end portion (hereinafter referred to as a lower end portion) on the transparent cover 6 side. The positioning hooks 23 define a relative positional relationship of the lens barrel 22 with respect to the plane direction of the upper surface of the transparent cover 6. A front end portion of each of the positioning hooks 23 is a member which protrudes downwardly from the side surface of the lower end portion of the lens barrel 22 along the direction (hereinafter referred to as a vertical direction) of the axis of the lens barrel 22, that is, downwardly lower than the lower end surface of the lens barrel 22. When the optical path fixing device 20 is fixedly combined to the imaging unit 1, the lower end surface of the lens barrel 22 comes into contact with the upper surface of the transparent cover 6. At this time, since the positioning hooks 23 come into contact with the peripheral side portions of four sides of the transparent cover 6, respectively, the relative positional relationship between the transparent cover 6 and the lens barrel 22 is fixed under a state where four positioning hooks 23 hold the transparent cover 6 from four directions. Since each distance between the pair of the two opposite positioning hooks 23 are made to be substantially equal to either the long side or the short side of the transparent cover 6, the relative positional relationship between the transparent cover 6 and the lens barrel 22 will hardly be disturbed. In case where the transparent cover 6 is formed in a square shape, each distances between each two pair of the two opposite positioning hooks 23 are made to be a distance substantially equal to any side of the transparent cover 6.

An elastic material 24 of a circular plate shape is fixedly mounted to the outer surface at substantially the center portion in the vertical direction of the lens barrel 22. Meanwhile, the support material 25 is formed in substantially a rectangular parallelepiped shape whose areas of the upper and lower surfaces are substantially equal to the areas of the upper and lower surfaces of the imaging unit 1. A through hole 26 of substantially a circular shape whose inner diameter is slightly greater than the outer diameter of the lens barrel 22 is bored penetrating between substantially the center potions of the upper and lower surfaces of the support material 25. Also, an annular groove 27 whose diameter is greater than the inner diameter of the through hole 26 is formed at substantially the center portion in the vertical direction of the through hole 26 in the support material 25. By inserting the elastic material 24 into the annular groove 27, the lens barrel 22 is supported in the through hole 26 of the support material 25 via the elastic material 24. The inner diameter and the width in the vertical direction of the annular groove 27 are slightly greater than the outer diameter and the thickness of the elastic material 24, respectively. Accordingly, the lens barrel 22 with the elastic material 24 can be slightly moved in the through hole 26 in both the vertical direction and the horizontal direction orthogonal to the vertical direction.

A pair of hook engaging portions 28 are provided at substantially the center portions of two opposite outer surfaces of the support material 25, respectively. The hook engaging portions 28 are grooves of a rectangular shape extending in the vertical direction at the two opposite outer surfaces of the support material 25, respectively. By engaging such hook engaging portions 28 with the arm portions 15 and hook portions 16 provided on the imaging unit 1, respectively, the imaging unit 1 is fixedly combined to the optical path fixing device 20. In order to engage the hook portion 16 of each arm portion 15, each upper end portion of the hook engaging portions 28 is made to be deeper than the other portion.

When the imaging unit 1 is fixedly combined to the optical path fixing device 20 by engagement of the arm portions 15 and hook portions 16 with the corresponding hook engaging portions 28, the upper surface of the sealing portion 14 of the imaging unit 1 and the lower surface of the support material 25 of the optical path fixing device 20 are fixed with each other under a state where both come into contact with each other. At this time, the lower end surface of the lens barrel 22 comes into contact with the upper end surface of the transparent cover 6 while four positioning hooks 23 come into contact with the peripheral side portions of the optical path fixing device 20 from four directions, hence fixing the relative positional relationship between the lens barrel 22 and the transparent cover 6. Simultaneously, the thickness of the support material 25, the length of the lens barrel 22, the mounting position of the elastic material 24 to the lens barrel 22, and the position of the annular groove 27 in the support material 25 are determined so that the upper end portion of the lens barrel 22 protrudes outwardly of the through hole 26, and that the portion on the outer surface of the lens barrel 22 at which the elastic material 24 is fixed is positioned above the annular groove 27 of the support material 25.

As the result, the lens barrel 22, which is deflected downwardly by the elastic material 24, is securely fixed to the elastic material 24 in being pressed state. As described previously, the lens barrel 22 and the elastic material 24 are movable in the though hole 26, and therefore the positional relationship of the transparent cover 6 and the lens barrel 22 are not affected even if any dimensional error on the sealing portion 14 or the support material 25 occurs. The positioning hooks 23 of the lens barrel 22 are so sized that they come in no contact with the upper surface of the sealing portion 14 when the lens barrel 22 has been fixed to the transparent cover 6. In addition, the lower end portion of the opening of the through hole 26 is increased in the inner diameter so as not to contact with the transparent cover 6 and the positioning hooks 23.

Figure 8:
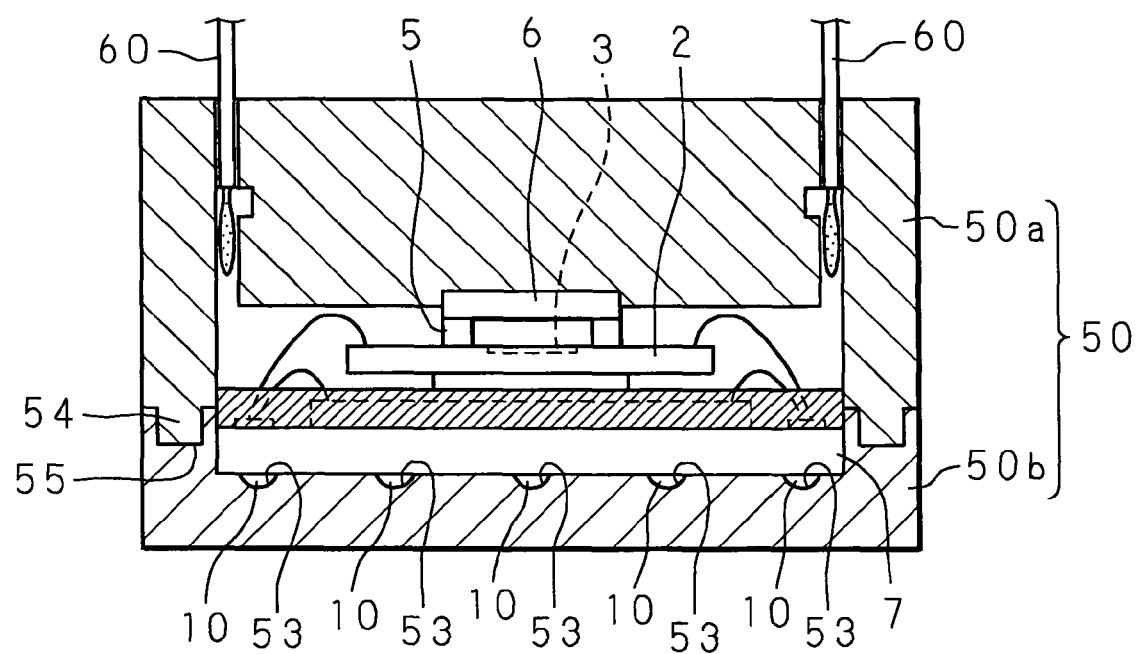
FIG. 8 is a schematic view showing a manufacturing process of the optical device module of the present invention.
Figure 9:
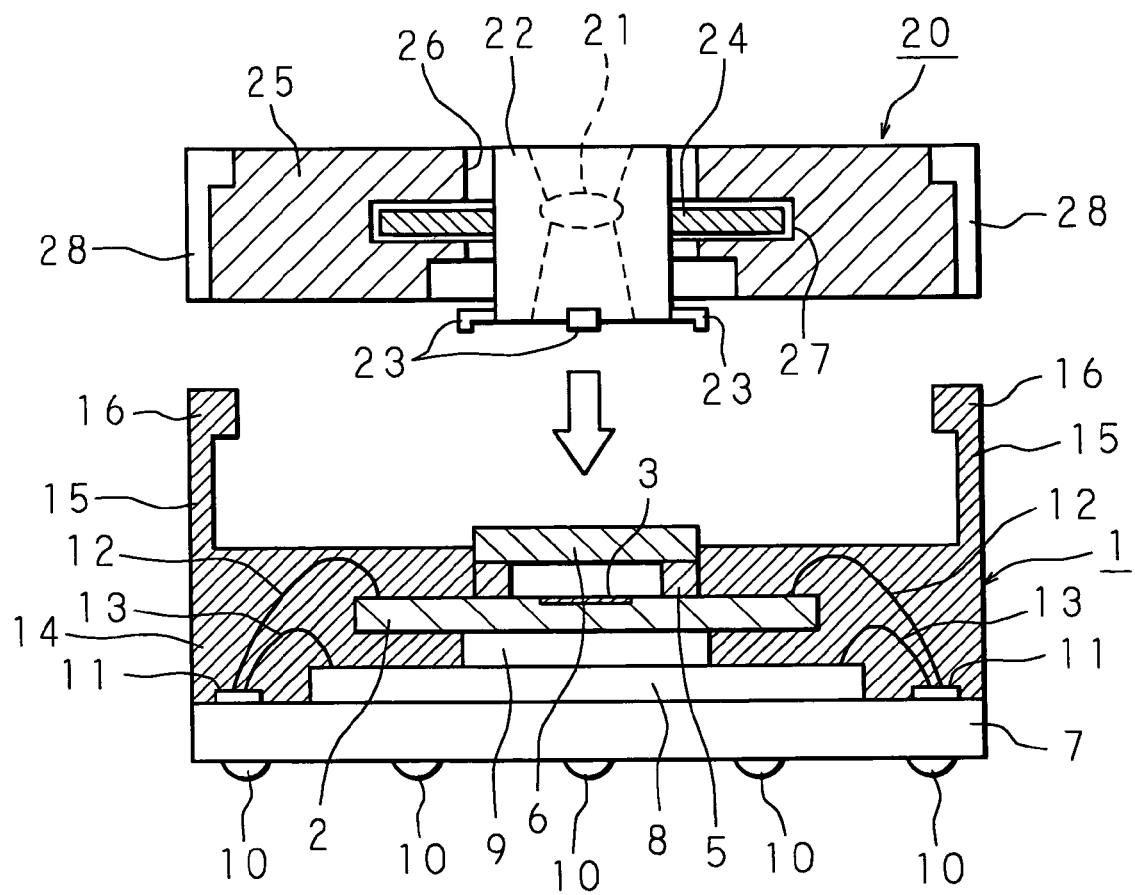
FIG. 9 is a schematic view showing a manufacturing process of the optical device module of the present invention.
Figure 10:
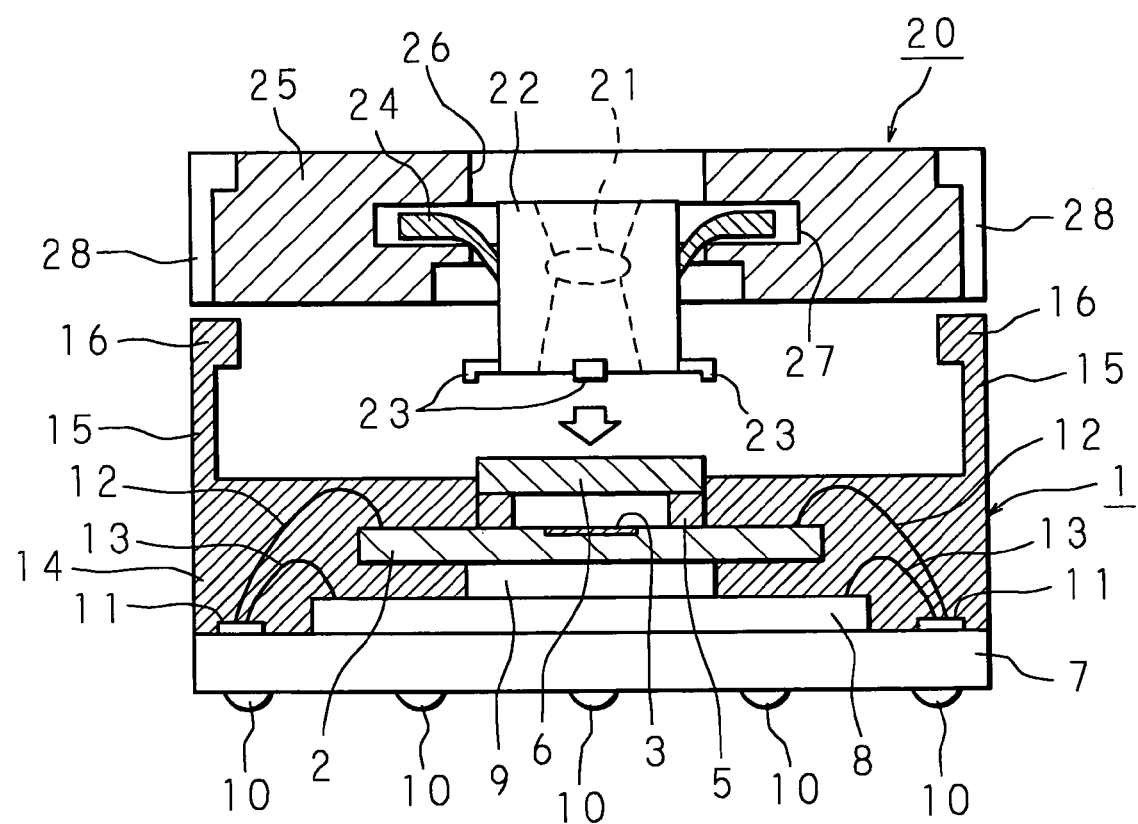
FIG. 10 is a schematic view showing a manufacturing process of the optical device module of the present invention.
Figure 11:
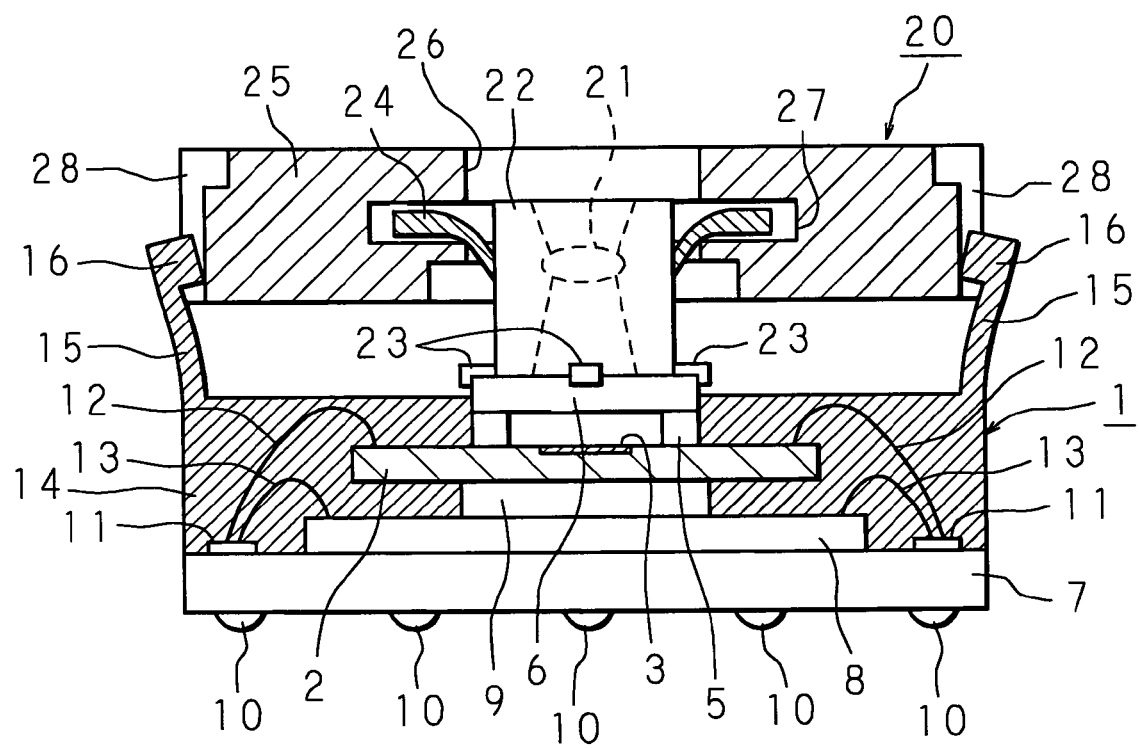
FIG. 11 is a schematic view showing a manufacturing process of the optical device module of the present invention.
Figure 12:
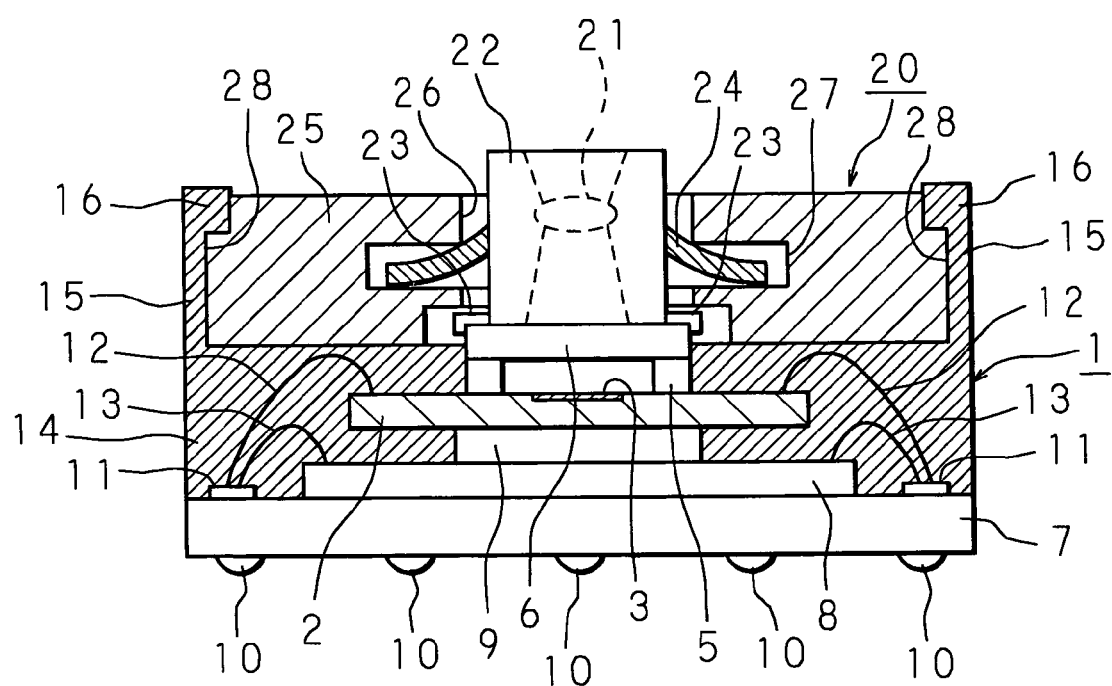
FIG. 12 is a schematic view showing a manufacturing process of the optical device module of the present invention.

FIG. 7 to FIG. 12 are schematic views showing a manufacturing process of the optical device module of the present invention. More particularly, FIG. 7 and FIG. 8 schematically illustrate a process of sealing the imaging unit 1 by a synthetic resin. FIG. 9 to FIG. 12 schematically illustrate a process of fixedly combining the optical path fixing device 20 to the imaging unit 1.

The DSP 8, the solid-state image sensor 2 and the like arranged by placing them upon the wiring board 7 are set in a die 50 for molding a synthetic resin. The die 50 is a box having a rectangular parallelepiped shape, and is divided into two parts of a lid unit 50a and a bottom unit 50b at substantially the center portion of the peripheral side surface in the vertical direction. A slot 55 is formed on the upper surface of the outer edge portion of the bottom unit 50b, while a protrusion 54 for fitting into the slot 55 is formed on the lower surface of the outer edge portion of the lid unit 50a. Accordingly, when the protrusion 54 is fitted into the slot 55, the die 50 can be shut closely.

Two hollows 56 for forming the two arm portions 15 and two hook portions 16 of the imaging unit 1 are provided in the upper side portion of the lid unit 50a. Filling inlets 51 from which the synthetic resin are filled is formed by penetrating the upper portions of the hollows 56 and upper surface of the lid unit 50a. A cavity 52 whose volume can just accept an upper side portion of the transparent cover 6 is formed at upper surface of inside the lid unit 50a. Accordingly, the upper side portion of the transparent cover 6 accepted in the cavity 52 exposes from the upper surface of the sealing portion 14 after the synthetic resin having been molded.

A bottom surface inside the bottom unit 50b has an area substantially equal to that of the wiring board 7. In order to closely contact the bottom surface inside the bottom unit 50b with the lower surface of the wiring board 7, a semi-spherical concave portions 53 for accepting the connectors 10 provided on the lower surface of the wiring board 7 are formed at the bottom surface inside the bottom unit 50b. Since the bottom surface inside the bottom unit 50b closely comes into contact with the lower surface of the wiring board 7, no portion of the synthetic resin is allowed to sneak into beneath the lower surface of the wiring board 7.

After the DSP 8, the solid-state image sensor 2 and the like arranged by placing them upon the wiring board 7 are set in the bottom unit 50b of the die 50, the protrusion 54 of the lid unit 50a is fitted into the slot 55 of the bottom unit 50b to shut closely the die 50. As a result, the interior of the die 50 can communicate with the two filling inlets 51 but not the outside. In this case, two filling tubes 60 are inserted into the respective filling inlets 51 of the die 50 (see FIG. 8), and then the synthetic resin is filled into the interior of the die 50 through the filling tubes 60. Thereafter, when the synthetic resin is cured, the sealing portion 14, the arm portions 15, and the hook portions 16 of the imaging unit 1 are molded.

After the imaging unit 1 is sealed by the synthetic resin as described above, the optical path fixing device 20 separately manufactured is fixedly combined to the imaging unit 1. More particularly, at first, in the state where the arm portions 15 and hook portions 16 of the imaging unit 1 do not engage with the hook engaging portions 28 of the optical path fixing device 20, only by pushing out the lens barrel 22 downwardly from the through hole 26 in the support material 25, the lower end surface of the lens barrel 22 comes into contact with the upper surface of the transparent cover 6, and the positioning hooks 23 hold the four side surfaces of the transparent cover 6 (see FIG. 9 to FIG. 11). Under keeping this state, by pressing the optical path fixing device 20 downwardly, the lower surface of the support material 25 of the optical path fixing device 20 comes contact with the upper surface of the sealing portion 14 of the imaging unit 1, and the arm portions and hook portions 16 of the imaging unit 1 engage with the corresponding hook engaging portions 28 of the optical path fixing device 20. As the result, the support material 25 is fixed to the imaging unit 1 by the arm portions 15 and the hook portions 16 under the state of not movable. At the same time, the lens barrel 22 is pressed down against the transparent cover 6 by the elasticity of the elastic material 24, so that the relative positional relationship between the lens barrel 22 and the transparent cover 6 is fixed.

In the optical device module configured mentioned above, the optical path fixing device 20 is fixedly combined to the imaging unit 1 under the state where the lower end surface of the lens barrel 22 comes contact with the upper surface of the transparent cover 6. Accordingly, the distance between the pixel area 3 of the solid-state image sensor 2 and the lens 21 can uniquely be determined by a sum of the thickness of the adhesive portion 5, the thickness of the transparent cover 6, and the distance between the lower end surface of the lens barrel 22 and the portion where the lens 21 is fixed. Also, since the positional relationship between the lens barrel 22 and the transparent cover 6 is fixed when the positioning hooks 23 on the lens barrel 22 hold all the peripheral surfaces of the transparent cover 6 from four directions, the positional relationship of the plane direction of the lens 21 with respect to the upper surface of the transparent cover 6 is uniquely determined. As described previously, since the transparent cover 6 is positioned at high accuracy with respect to the pixel area 3 and adhered to the same of the solid-state image sensor 2, the lens barrel 22 is positioned, determining the transparent cover 6 as the reference, with respect to the pixel area 3 of the solid-state image sensor 2 with high accuracy and adhered to the same.

Moreover, the solid-state image sensor 2, the DSP 8 and the like of the imaging unit 1 are sealed by the synthetic resin and can thus be protected from any external impact as well as facilitated in the manufacturing process. The lens barrel 22 of the optical path fixing device 20 is supported by the support material 25 via the elastic material 24, and the elastic material 24 is movable in the annular groove 27 in the support material 25. Accordingly, since the lens barrel 22 and the support material 25 are fixed to the imaging unit 1 by separate processes, the lens 21 can securely be positioned with respect to the solid-state image sensor 2 regardless of any dimensional error of the sealing portion 14 and/or the support material 25.

Although the positioning hooks 23 are mounted on the lens barrel 22 of the optical path fixing device 20 in the embodiment, they may be omitted. In this case, positioning of the plane direction may be carried out in the process of coming into contact the lower surface of the lens barrel 22 with the upper surface of the transparent cover 6, and thereafter the support material 25 may be fixed to the imaging unit 1.

While the solid-state image sensor 2 and the DSP 8 as an signal processing device are respectively placed upon the substrate as separate semiconductor chips in the embodiment, the solid-state image sensor 2 and the DSP 8 may be integrated to be a single semiconductor chip.

Alternatively, any other semiconductor chip than the DSP 8 may be placed upon the substrate together with the solid-state image sensor 2 or a more number of semiconductor chips may be placed upon together.

The shape of the die for sealing by the synthetic resin in the embodiment is illustrative in one example, and the present invention is not limited to such an example.

Also, the shapes of the arm portions 15, the hook portions 16, and the hook engaging portions 28 for fixing the imaging unit 1 and the optical path fixing device 20 are illustrative in one example but not of limitations.

The elastic material 24 is not limited to a circular plate shape but may be arranged of any appropriate shape such as a cross shape or the like.

As this invention may be embodied in several forms without departing from the spirit of essential characteristics thereof, the embodiment is therefore illustrative and not restrictive, since the scope of the present invention is defined by the appended claims rather than by the description preceding them, and all changes that fall within metes and bounds of the claims, or equivalence of such metes and bounds thereof are therefore intended to be embraced by the claims.

What is claimed is:

1. An optical device module comprising:
   an imaging unit including a solid-state image sensor having a pixel area, a transparent cover provided opposite to said pixel area, and an adhesive portion for adhering said transparent cover to said solid-state image sensor;
   an optical path fixing device which includes an optical component, a holding material for holding said optical component, an elastic material fixed to said holding material and a support material for supporting said elastic material, and fixes the optical path between said optical component and said pixel area; said holding material being connected to said support material via said elastic material; and combining means for fixedly combining said optical path fixing device to said imaging unit;

wherein said imaging unit comprises a sealing portion that is molded with a synthetic resin to seal said solid-state image sensor with said transparent cover, wherein a part of or all of said transparent cover is exposed, said combining means fixedly combines said optical path fixing device to said imaging unit so that said optical path fixing device is positioned with respect to said imaging unit in a state where said holding material comes into contact with the exposed portion of said transparent cover outwardly of said sealing portion; and wherein said optical path fixing device is fixedly combined to said imaging unit by said combining means, said holding material is pressed down against said transparent cover by the action of said elastic material while said holding material remains in contact with the one surface of said transparent cover.

2. The optical device module as set forth in claim 1, wherein said elastic material is supported by said support material, and is movable with respect to said support material.

3. The optical device module as set forth in claim 2, wherein said holding material and positioning members are sized so as not to come into contact with said sealing portion when said optical path fixing device is fixedly combined to said imaging unit, wherein said holding material includes said positioning members provided for determining the relative positional relationship to said transparent cover.

4. The optical device module as set forth in claim 1, wherein said holding material includes positioning members provided for determining the relative positional relationship to said transparent cover.

5. The optical device module as set forth in claim 4, wherein said transparent cover has a plate-like shape and whose one surface and a part of or all of the side surfaces are exposed from said sealing portion, and said positioning members are hook shaped members for engaging with at least two portions of the side surfaces of said transparent cover when said holding material comes into contact with said one surface of said transparent cover.

6. The optical device module as set forth in claim 5, wherein said optical path fixing device includes an elastic material fixed to said holding material, and a support material for supporting said elastic material, and when said optical path fixing device is fixedly combined to said imaging unit by said combining means, said holding material is pressed down against said transparent cover by the action of said elastic material while said holding material remains in contact with the one surface of said transparent cover.

7. The optical device module as set forth in claim 6, wherein said elastic material is supported by said support material, and is movable with respect to said support material.

8. The optical device module as set forth in claim 7, wherein said holding material and said positioning members are sized so as not to come into contact with said sealing portion when said optical path fixing device is fixedly combined to said imaging unit.

9. The optical device module as set forth in claim 1, wherein said combining means includes hook portions provided on said imaging unit, and hook engaging portions provided on said optical path fixing device for engaging with said hook portions, and said optical path fixing device is fixedly combined to said imaging unit by engaging said hook portions and said hook engaging portions.

10. The optical device module as set forth in claim 9, wherein said hook portions are formed integral with said sealing portion by the synthetic resin.

11. The optical device module as set forth in claim 10, wherein said holding material includes positioning members provided for determining the relative positional relationship to said transparent cover.

12. The optical device module as set forth in claim 11, wherein said transparent cover has a plate-like shape and whose one surface and a part of or all of the side surfaces are exposed from said sealing portion, and said positioning members are hook shaped members for engaging with at least two portions of the side surfaces of said transparent cover when said holding material comes into contact with said one surface of said transparent cover.

13. The optical device module as set forth in claim 12, wherein said optical path fixing device includes an elastic material fixed to said holding material, and a support material for supporting said elastic material, and when said optical path fixing device is fixedly combined to said imaging unit by said combining means, said holding material is pressed down against said transparent cover by the action of said elastic material while said holding material remains in contact with the one surface of said transparent cover.

14. The optical device module as set forth in claim 13, wherein said elastic material is supported by said support material, and is movable with respect to said support material.

15. The optical device module as set forth in claim 14, wherein said holding material and said positioning members are sized so as not to come into contact with said sealing portion when said optical path fixing device is fixedly combined to said imaging unit.

16. The optical device module as set forth in claim 1, wherein said imaging unit includes a wiring board on which conductor wirings are formed, and an signal processing device mounted on said wiring board and electrically connected to said conductor wirings, and said sealing portion seals said solid-state image sensor and said transparent cover together with said wiring board and said signal processing device by the synthetic resin.

17. The optical device module as set forth in claim 16, wherein said combining means includes hook portions provided on said imaging unit, and hook engaging portions provided on said optical path fixing device for engaging with said hook portions, and said optical path fixing device is fixedly combined to said imaging unit by engaging said hook portions and said hook engaging portions.

18. The optical device module as set forth in claim 17, wherein said hook portions are formed integral with said sealing portion by the synthetic resin.

19. The optical device module as set forth in claim 18, wherein said holding material includes positioning members provided for determining the relative positional relationship to said transparent cover.

20. The optical device module as set forth in claim 19, wherein
said transparent cover has a plate-like shape and whose one surface and a part of or all of the side surfaces are exposed from said sealing portion, and
said positioning members are hook shaped members for engaging with at least two portions of the side surfaces of said transparent cover when said holding material comes into contact with said one surface of said transparent cover.

21. The optical device module as set forth in claim 20, wherein
said optical path fixing device includes an elastic material fixed to said holding material, and a support material for supporting said elastic material, and
when said optical path fixing device is fixedly combined to said imaging unit by said combining means, said holding material is pressed down against said transparent cover by the action of said elastic material while said holding material remains in contact with the one surface of said transparent cover.

22. The optical device module as set forth in claim 21, wherein said elastic material is supported by said support material, and is movable with respect to said support material.

23. The optical device module as set forth in claim 22, wherein said holding material and said positioning members are sized so as not to come into contact with said sealing portion when said optical path fixing device is fixedly combined to said imaging unit.

24. An optical path fixing device comprising:
an optical component whose optical path to an object is to be determined, and a holding material for holding said optical component; and for fixing the optical path between said optical component and said object, wherein said holding material includes a positioning member for determining the relative positional relationship with respect to said object;
an elastic material fixed to said holding material, and
a support material for supporting said elastic material, wherein
said elastic material is supported by said support material, and is movable with respect to said support material.

25. A method for manufacturing an optical device module which comprises:
an imaging unit including a solid-state image sensor having a pixel area,
a transparent cover provided opposite to said pixel area,
an adhesive portion for adhering said transparent cover to said solid-state image sensor; and
an optical path fixing device which includes an optical component, a holding material for holding said optical component, an elastic material fixed to said holding material, and a support material for supporting said elastic material and for fixing an optical path between said optical component and said pixel area; said holding material being connected to said support material via said elastic material;
wherein
said imaging unit comprises a sealing portion that is molded with a synthetic resin so as to seal said solid-state image sensor with said transparent cover such that a part or all of said transparent cover exposed; and
said adhesive portion fixedly combines said optical path fixing device to said imaging unit such that said optical path fixing device is position with respect to said imaging unit in a state where said holding material comes into contact with the exposed portion of the transparent cover outwardly of said adhesive portion; and
said method comprising:
a sealing step of sealing said solid-state image sensor and said transparent cover by a synthetic resin; and
a step of fixedly combining said optical path fixing device to said imaging unit in a case where said holding material comes into contact with said transparent cover such that said holding material is pressed down against said transparent cover by said elastic material.

26. The method for manufacturing an optical device module as set forth in claim 25, wherein said sealing step further includes the step of forming, by a synthetic resin, hook portions for fixedly combining said optical path fixing device to said imaging unit.

27. The method for manufacturing an optical device module as set forth in claim 25, wherein said sealing step further includes the step of sealing, by a synthetic resin, a wiring board on which conductor wirings are provided, and an signal processing device which is fixed to said wiring board and electrically connected to said conductor wirings.

* * * * *